US005907638A

United States Patent [19]

Onodera

[11] Patent Number: 5,907,638
[45] Date of Patent: May 25, 1999

[54] DATA COMPRESSION APPARATUS, METHOD AND SYSTEM

[75] Inventor: Ken Onodera, Yokohama, Japan

[73] Assignee: Canon Kabushiki Kaisha, Tokyo, Japan

[21] Appl. No.: 08/969,065

[22] Filed: Nov. 12, 1997

[30]  Foreign Application Priority Data

Nov. 18, 1996  [JP]  Japan ................................. 8-306605

[51] Int. Cl.[6] ............................ G06K 9/36; G06K 9/46
[52] U.S. Cl. ...................... 382/239; 382/232; 382/233; 382/244; 382/246
[58] Field of Search .................................. 382/232, 233, 382/239, 244, 246; 395/114; 358/426, 427, 430, 261.2; 348/390, 404; 341/50, 51, 106, 107, 67

[56]  References Cited

U.S. PATENT DOCUMENTS

| 4,796,003 | 1/1989 | Bentley et al. ........................... 341/95 |
| 5,239,298 | 8/1993 | Wei ........................................... 341/51 |
| 5,450,562 | 9/1995 | Rosenberg et al. ...................... 395/446 |

OTHER PUBLICATIONS

Tomohiko Uematsu, et al., "A Data Compression Algorithm And Its Realization", Interface, Aug. 1992, pp. 118–123; partial translation of same.

Jon L. Bentley, et al., "A Locally Adaptive Data Compression Scheme", Communications of the ACM, vol. 29, No. 4, Apr. 1986, pp. 320–330.

Primary Examiner—Leo H. Boudreau
Assistant Examiner—Dmitry A. Novik
Attorney, Agent, or Firm—Fitzpatrick, Cella, Harper & Scinto

[57]  ABSTRACT

Conventionally, when compressing data, since data (words) are sequentially retrieved from the head of a dictionary, a large amount of time is required for compression processing. Particularly when compression/expansion processing is performed a plurality of times, a large amount of processing time is required. In order to solve such problems, input data is dealt with as a set of words having a specific number of bytes, and a word retrieval table having a size equal to or larger than the size of a dictionary for registering words is provided. By storing the position of each word registered in the dictionary in the word retrieval table, it is unnecessary to sequentially retrieve data (a word) from the head of the dictionary, so that compression/expansion processing can be promptly performed.

21 Claims, 17 Drawing Sheets

FIG.2

|    | CODE I        | CODE II       |
|----|---------------|---------------|
| 1  | 1             | 1             |
| 2  | 010           | 0100          |
| 3  | 011           | 0101          |
| 4  | 00100         | 01100         |
| 5  | 00101         | 01101         |
| 6  | 00110         | 01110         |
| 7  | 00111         | 01111         |
| 8  | 0001000       | 00100000      |
| ...| ...           | ...           |
| 16 | 000010000     | 001010000     |
| 17 | 000010001     | 001010001     |
| ...| ...           | ...           |
| 32 | 00000100000   | 0011000000    |

FIG.17

| DIRECTORY INFORMATION |
| :---: |
| ⋮ |
| #1 DATA COMPRESSION PROGRAM |
| #2 DATA EXPANSION PROGRAM |
| ⋮ |
| CODE TABLE |
| ⋮ |

DATA COMPRESSION APPARATUS, METHOD AND SYSTEM

BACKGROUND OF THE INVENTION

1. Field of the Invention

This invention relates to a data compression apparatus, method and system for compressing input data.

2. Description of the Related Art

In conventional data compression apparatuses for compressing input data, data is compressed by dealing with data as a set of words having a specific number of bytes, and allocating a code having a short bit length and a code having a long bit length to a word of high frequency of appearance and to a word of low frequency of appearance, respectively, by utilizing deviation in the frequency distribution of words. Huffman coding is well-known as such a compression method.

In such a compression method, however, it is necessary to first form the frequency distribution of data. As a result, data cannot be processed through a single path.

In order to solve such a problem, a universal encoding method called a Bentley-Sleator-Tarjan-Wei (BSTW) algorithm has been developed as a method for processing data through a single path. In this encoding method, a dictionary of words in data is shared by encoding and decoding. When a word provided in the dictionary appears in data, the dictionary is updated according to processing called head movement in which the word is moved to the head (or a leading portion) of the dictionary. Accordingly, as head movement is continued, words having high frequencies of appearance are collected to a leading portion of the dictionary. Since information relating to the position of each word registered in the dictionary is output as an code output, a word having a high frequency of appearance is output as information relating to a position close to the head of the dictionary. If short code lengths and long code lengths are allocated to information relating to positions close to the head and to information relating to positions separated from the head, respectively, short code lengths and long code lengths are allocated to words having high frequencies of appearance and to words having low frequencies of appearance, respectively, so that compression of code lengths in the entire information is realized.

The above-described Huffman codes, areas codes and the like are used as variable-length codes.

In the above-described conventional methods, however, in order to change the position of an existing word in the dictionary, it is necessary to retrieve the word in the dictionary. Since the arrangement of a word within the dictionary depends on the state of appearance of the word and words are not sorted, the retrieval must be performed by comparing the word with each word in the dictionary. Accordingly, when retrieving the word starting from the head of the dictionary, it is necessary to compare the word with almost all words in the dictionary if the word has a low frequency of appearance, resulting in a large amount of time for encoding processing.

Furthermore, when outputting image data including a plurality of objects to be drawn (depicted) in a printing apparatus, it is necessary, in some cases, to repeat compression and expansion of the image data a plurality of times. Hence, if a large amount of time is required for encoding processing, an output time becomes a time required for compression and expansion multipled by the plurality of times.

SUMMARY OF THE INVENTION

It is an object of the present invention to solve the above-described problems.

A data compression apparatus according to the present invention deals with input data as a set of words having a specific number of bytes, and retrieves a word in a dictionary. If the word is not found in the dictionary, the word is registered in the dictionary. If the word is found in the dictionary, the position of registration of the word is up-dated to a forward position. Information relating to the position of each word in the dictionary is output in the form of a variable-length code. The apparatus also includes a word retrieval table having a size equal to or greater than the size of the dictionary. An input word is retrieved from the dictionary using the word retrieval table. Every time the contents of the dictionary are updated, the word retrieval table is updated.

According to one aspect, the present invention which achieves the above-described object relates to a data compression apparatus for compressing input data. The apparatus includes dictionary means for registering words, word retrieval table means for storing information relating to the position of each word stored in the dictionary means, encoding means for performing variable-length encoding of information relating to the position of an input word in the dictionary, and expansion means for returning a variable-length code obtained by the encoding means to an original word. Input data is dealt with as a set of words having a specific number of bytes, and a word is retrieved by the word retrieval table means. If the word is not found, the word is registered in the dictionary means. If the word is found, the position of registration of the word is updated to a forward position. Every time the contents of the dictionary means are updated, the word retrieval table means is updated.

According to another aspect, the present invention which achieves the above-described object relates to a data compression method for compressing input data. The method includes the steps of registering words in a dictionary, storing information relating to the position of each word stored in the dictionary in the registering step in a word retrieval table, performing variable-length encoding of information relating to the position of an input word registered in the dictionary in the registering step, and returning a variable-length code obtained by the encoding step to an original word. Input data is dealt with as a set of words having a specific number of bytes, and a word is retrieved from the word retrieval table storing the information relating to the position of each word in the position-information storing step. If the word is not found, the word is registered in the dictionary in the registering step. If the word is found, the position of registration of the word is updated to a forward position. Every time the registration step updates the contents registered in the dictionary, the position-information storing step updates the information relating to the position of each word in the word retrieval table.

According to still another aspect, the present invention which achieves the above-described object relates to a program stored in a storage medium for realizing compression of input data. The program includes a program code of a registering step of registering words in a dictionary, a program code of a position-information storing step of storing information relating to the position of each word registered in the dictionary in the registering step in a word retrieval table, a program code of an encoding step of performing variable-length encoding of information relating to the position of an input word registered in the dictionary in the registering step, and a program code of an expanding step of returning a variable-length code obtained by the encoding step to an original word. Input data is dealt with as a set of words having a specific number of bytes, and a word is retrieved from the word retrieval table storing the information relating to the position of each word in the storing step. If the word is not found, the word is registered in the dictionary in the registering step. If the word is found, the position of registration of the word is updated to a forward position. Every time the registring step updates the contents registered in the dictionary, the position-information storing step updates the information relating to each word in the word retrieval table.

According to yet another aspect, the present invention which achieves the above-described object relates to a printing system in which a host computer transmits printing data to a printer, and the printer prints the printing data received from the host computer. The system includes dictionary means for registering words, word retrieval table means for storing information relating to the position of each word stored in the dictionary means, encoding means for performing variable-length encoding of information relating to the position of an input word in the dictionary, and expansion means for returning a variable-length code obtained by the encoding means to an original word. Input data is dealt with as a set of words having a specific number of bytes, and a word is retrieved by the word retrieval table means. If the word is not found, the word is registered in the dictionary means. If the word is found, the position of registration of the word is updated to a forward position. Every time the contents of the dictionary means are updated, the word retrieval table means is updated.

In the data compression apparatus of the present invention, it is unnecessary to retrieve an existing word in the dictionary in order to change the position of the word in the dictionary. Hence, the problems in the conventional methods that a large amount of time is required for encoding processing, because the arrangement of a word within the dictionary depends on the state of appearance of the word and because words are not sorted, are solved in the present invention.

BRIEF DESCRIPTION OF THE DRAWINGS

FIG. 2 is a diagram illustrating an example of areas codes stored in an areas-code table 106 shown in FIG. 1;

FIG. 17 is a diagram illustrating the configuration of a storage medium storing control programs used in the present invention.

DESCRIPTION OF THE PREFERRED EMBODIMENTS

First Embodiment

Figure 1:
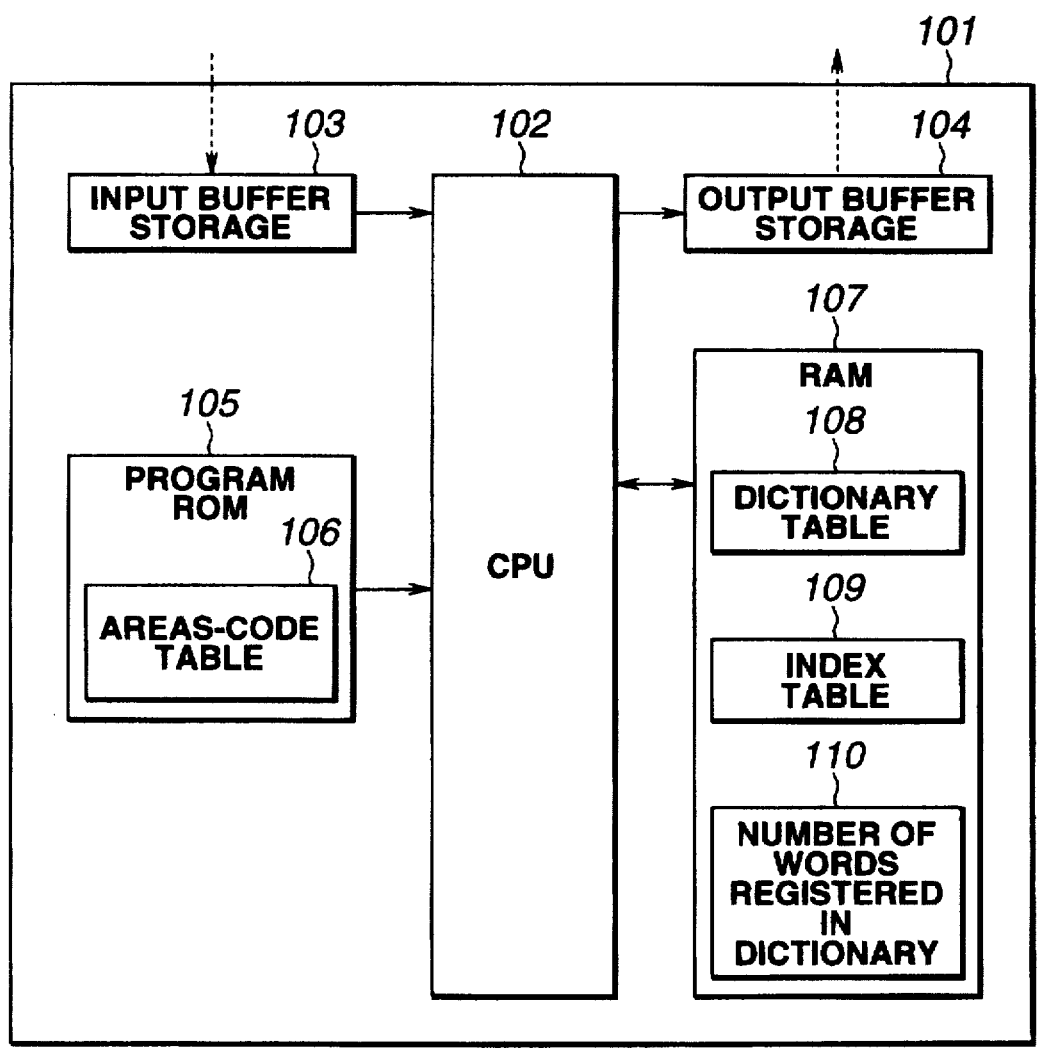
FIG. 1 is a block diagram illustrating the configuration of compression apparatus according to a first embodiment of the present invention.

FIG. 1 is a block diagram illustrating the detailed configuration of a compression apparatus according to a first embodiment of the present invention.

In FIG. 1, reference numeral 101 represents a main body of the compression apparatus. A CPU (central processing unit) 102 controls the entirety of the main body 101. An input buffer storage 103 temporarily stores data before compression supplied from a data source (not shown). An output buffer storage 104 temporarily stores data compressed by the compression apparatus, and outputs the data to an external apparatus to which the data is to be output (not shown). A program ROM (read-only memory) 105 stores programs with which the CPU 102 executes a series of control procedures (to be described later), and an areas-code table 106 used in compression processing which will be described later. A RAM (random access memory) 107 provides work areas to be used when the CPU 102 executes programs, and stores a dictionary table 108 and an index table 109 which are used in the compression processing, and a number of words 110 currently registered in the dictionary.

FIG. 2 shows an example of areas codes stored in the areas-code table 106. Code I comprises 0's whose number equals the number of digits (the number of bits) of an integer x expressed in binary notation minus 1 followed by the x expressed in binary notation, i.e., the display of the number of digits of x expressed by the number of 0's followed by the x in binary notation (always starting from 1). On the other hand, code II utilizes code I instead of the first display of the number of digits. That is, code II comprises the number of digits (the number of bits) when expressing x in binary notation expressed by code I followed by the binary notation of x with removing the leading 1. The number of bits can be further reduced by utilizing code II for display of the number of digits. However, since only very little merit is obtained according to this approach, only codes I and II are often used in actual encoding. In the first embodiment, code I is used.

In the above-described configuration, a description will be provided of steps for a compression control program which are stored in the program ROM 105 and are executed by the CPU 102, with reference to FIGS. 2 through 11.

When a compression control program has been started by the CPU 102, values in the input buffer storage 103, the output buffer storage 104, the dictionary table 108, the index table 109 and the number of words 110 registered in the dictionary are cleared. The maximum number of words stored in the dictionary table 108 is assumed to be N (N>3). Then, data is supplied from the data source and is input to the input buffer storage 103. The input data is assumed to be "abaacded".

Figure 3:
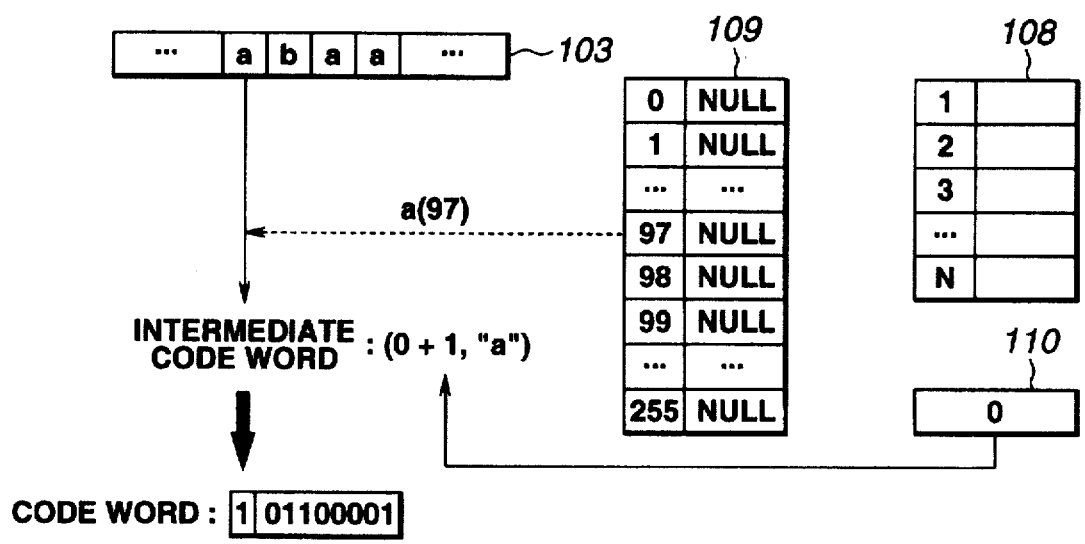
FIGS. 3 through 11 are diagrams illustrating procedures of compression control in the first embodiment.

First, as shown in FIG. 3, the CPU 102 reads the data temporarily stored in the input buffer storage 103 from the leading portion in units of a byte. The CPU 102 first reads a. The 97th position in the index table 109 is referred to based on a value 97 in decimal notation corresponding to 61 in hexadecimal notation which is the ASCII code for a. Since the contents of the index table 109 are all initialized to NULL, the 97th position also acquires NULL. Since NULL indicates that the word is not yet registered in the dictionary, a value obtained by adding 1 to the number of words 110 registered in the dictionary stored in a register for storing the current number of words registered in the dictionary followed by the word a (97) to be registered constitute an intermediate code word. The actual code word is "101100001" obtained by adding the ASCII code "01100001" for a (97) to a display "1" indicating an integer 1 according to areas code I. The actual code word is temporarily stored in the output buffer storage 104, and is then output to the external apparatus.

Figure 4:
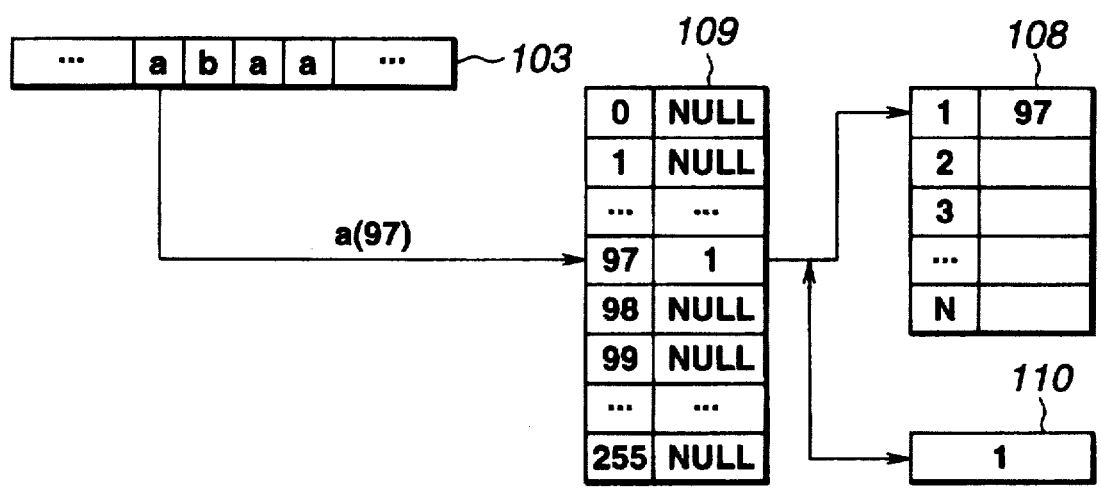

Then, as shown in FIG. 4, the CPU 102 writes the position of the last data in the dictionary up to present (i.e., the number of data registered in the dictionary 110=0) at the 97th position of the index table 109. When no data is registered, 1 is written. Then, the reference position (97) in the index table is written in the above-described position (1) in the dictionary 108. Finally, the number of data 110 registered in the dictionary is incremented by the CPU 102.

Figure 5:
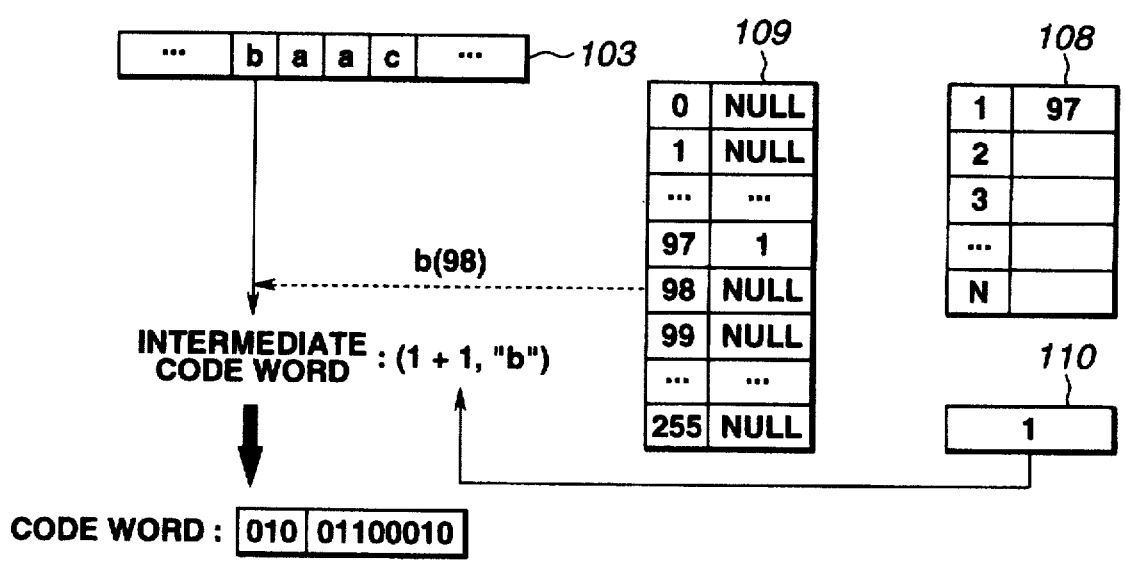

When that character has been output, as shown in FIG. 5, the CPU 102 updates the contents of the input buffer storage 102, and the next 1-byte b is read. The 98th position in the index table 109 is referred to based on a value 98 in decimal notation which is the ASCII code for b, and NULL indicating an initialized state is also acquired for this value. Since NULL indicates that the data is not yet registered in the dictionary, a value (1+1=2) obtained by adding 1 to the current number 110 (1) of data registered in the dictionary followed by the word b (98) to be registered constitute an intermediate code word. The actual code word is "01001100010" obtained by adding the ASCII code "01100010" for b (98) to a display "010" indicating an integer 2 according to areas code I. The actual code word is temporarily stored in the output buffer storage 104, and is then output to the external apparatus.

Figure 6:
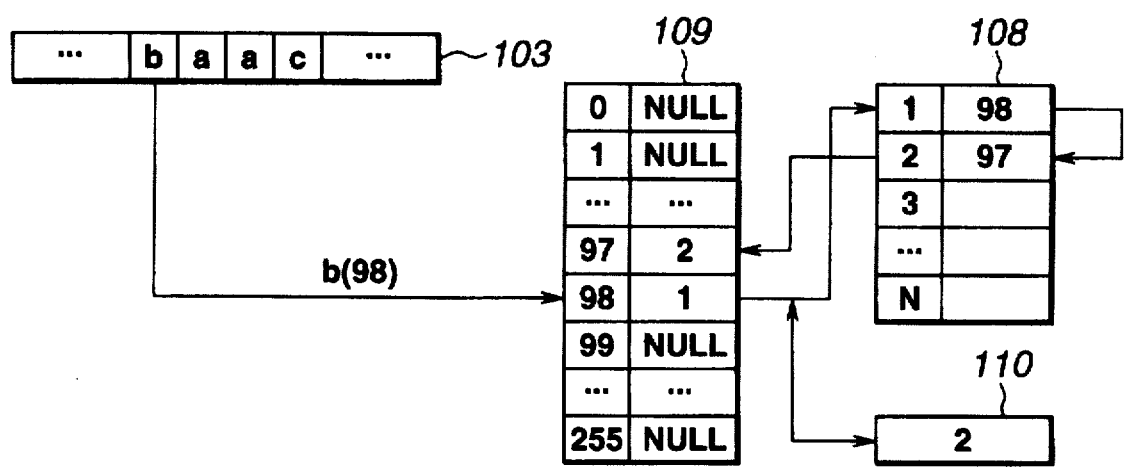

Then, as shown in FIG. 6, the position of the last data in the dictionary, i.e., the number of data 110 (1) registered in the dictionary in FIG. 5 is written in the 98th position of the index table 109. The value (97) of the above-described position (1) in the dictionary 108 is retracted to an immediately succeeding position (2) in the dictionary. The reference position (98) in the index table is written in the above-described position (1) in the dictionary 108. The value of the 97th position in the index table 109 corresponding to the value (97) retracted to the position (2) is updated to the retracted position (2) of the dictionary. Finally, the number of data 110 registered in the dictionary is incremented. The CPU 102 registers the word newly registered in the above-described manner in a position immediately before the last position in the dictionary.

Figure 7:
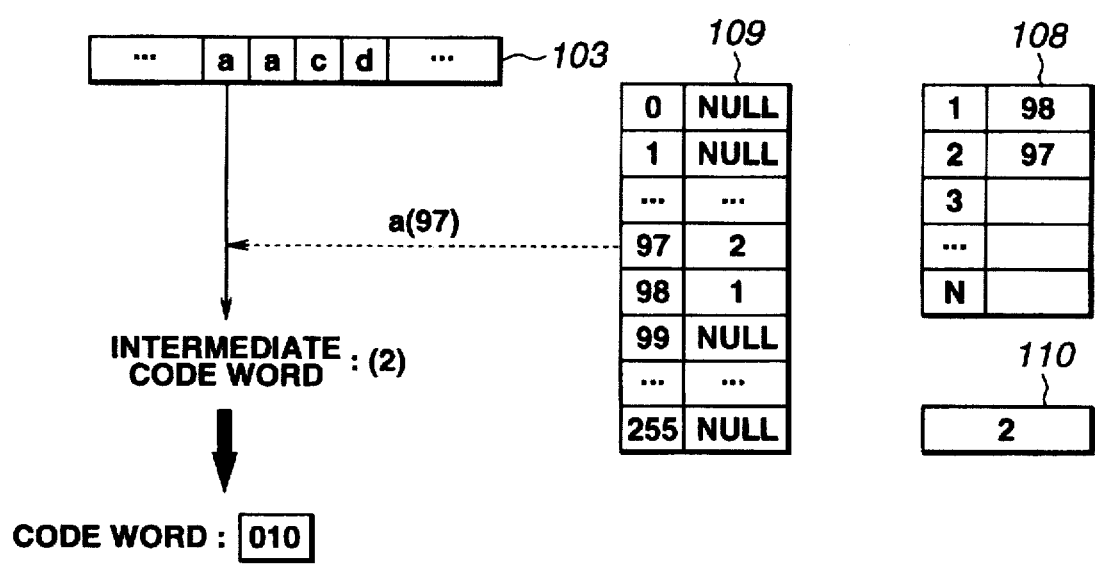

When that character has been output, as shown in FIG. 7, the CPU 102 updates the value of the input buffer storage 102, and the next 1-byte a is read. The CPU 102 refers to the 97th position in the index table 109 based the value 97 in decimal notation which is the ASCII code for a, and a dictionary registration number 2 is acquired. This integer 2 is used as an intermediate code word. The actual code word is a display "010" according to the areas code I for the integer 2. This code word is temporarily stored in the output buffer storage 104, and is then output to the external apparatus.

Figure 8:
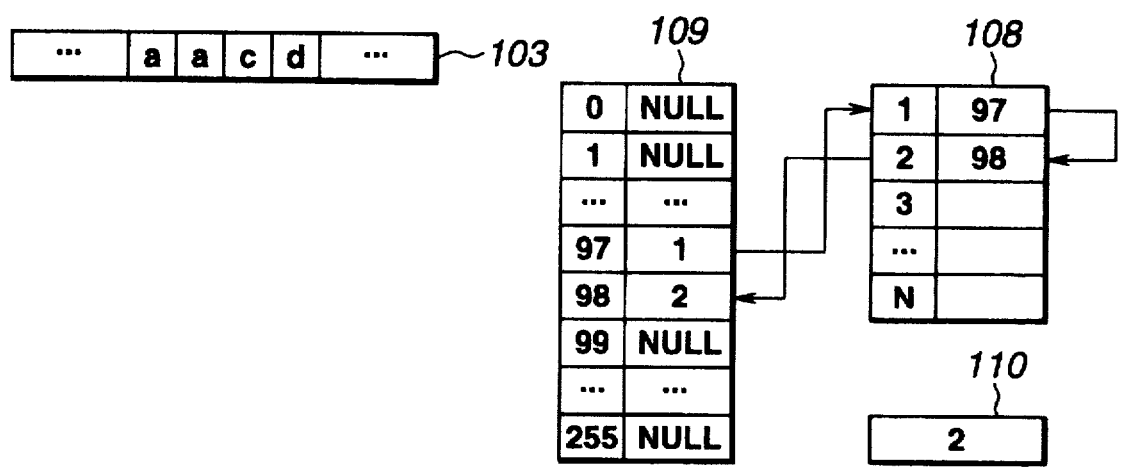

Then, as shown in FIG. 8, the value 97 stored in the dictionary position 2 stored in the index table 109 is replaced by an immediately preceding value (98 in this case) in the dictionary, and the dictionary position stored in the 98th position of the index table 109 corresponding to the value 98 stored in the immediately preceding dictionary is updated. Since there is no newly registered word, the number of data 110 registered in the dictionary is not updated. Thus, when an already registered word is input, the dictionary position where the word is stored is replaced by an immediately preceding value, and the corresponding value of the index table is changed.

Figure 9:
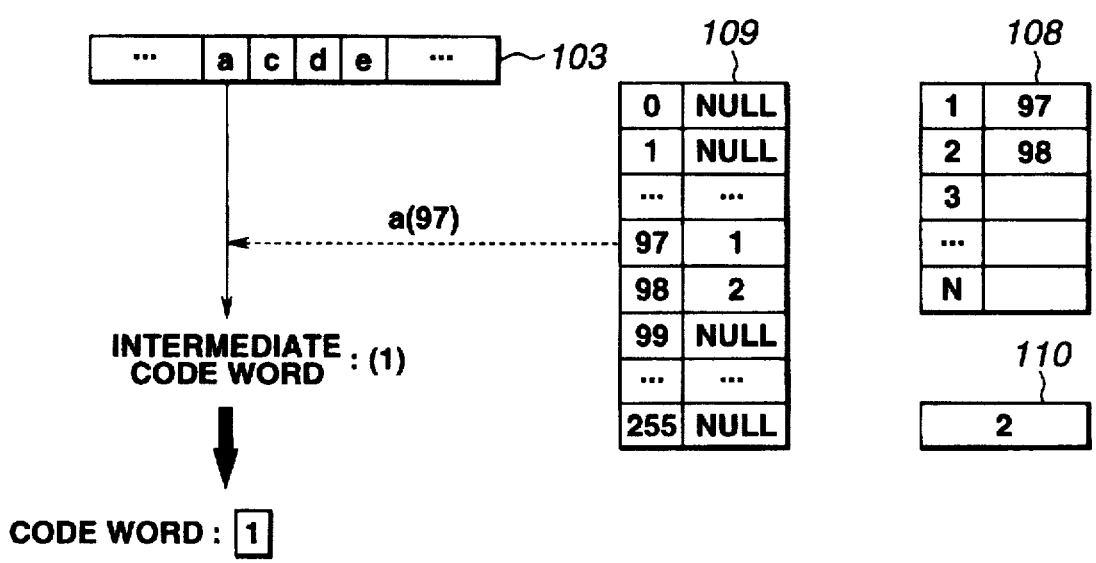

When that character has been output, as shown in FIG. 9, the CPU 102 updates the value of the input buffer storage 102, and the next 1-byte a is read. The CPU 102 refers to the 97th position in the index table 109 based on the value 97 in decimal notation which is the ASCII code for a, and a dictionary registration number 1 is acquired. This integer 1 is used as an intermediate code word. The actual code word is a display "1" according to the areas code I for the integer 1. This code word is temporarily stored in the output buffer storage 104 by the CPU 102, and is then output to the external apparatus. In this case, since the dictionary registration number is at the head of the dictionary, the contents of the dictionary are not updated. In addition, since there is no word newly registered in the dictionary, the number of words 110 registered in the dictionary is not updated.

Figure 10:
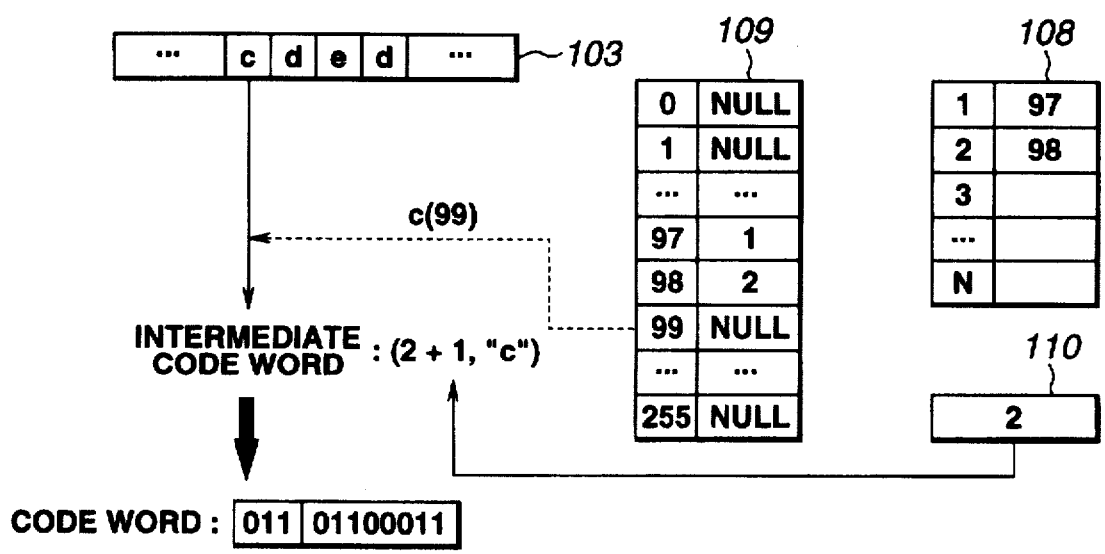

When that character has been output, as shown in FIG. 10, the CPU 102 updates the contents of the input buffer storage 102, and the next 1-byte c is read. The 99th position in the index table 109 is referred to based on a value 99 in decimal notation which is the ASCII code for c, and NULL indicating an initialized state is acquired for this value. Since NULL indicates that the data is not yet registered in the dictionary, a value (2+1=3) obtained by adding 1 to the current number 110 (2) of data registered in the dictionary followed by the word c (99) to be registered constitute an intermediate code word. The actual code word is "01101100011", obtained by adding the ASCII code "01100011" for c (99) to a display "011" indicating an integer 3 according to areas code I. The actual code word is temporarily stored in the output buffer storage 104 by the CPU 104, and is then output to the external apparatus.

Figure 11:
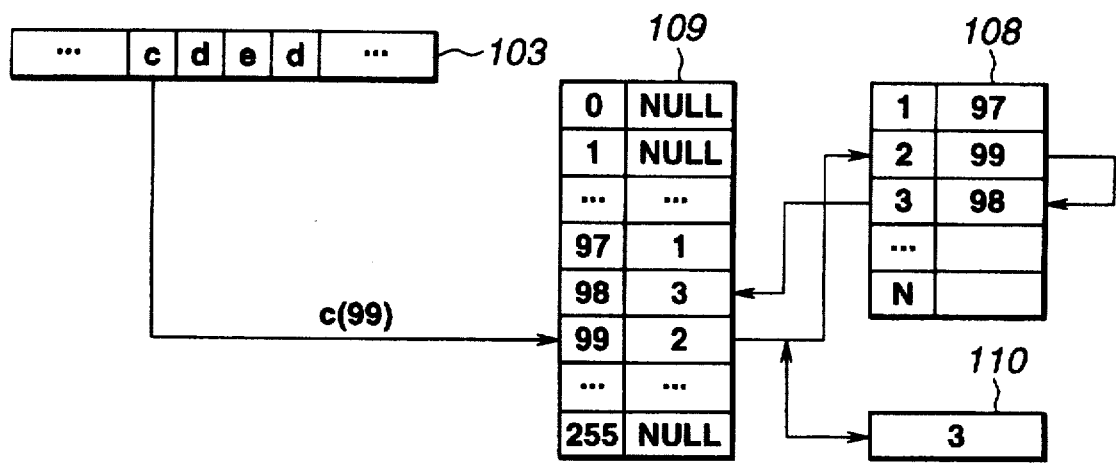

Then, as shown in FIG. 11, the position of the last data in the dictionary (i.e., the number of data 110=2 registered in the dictionary) is written in the 99th position of the index table 109. The value (98) of the above-described position (2) in the dictionary 108 is retracted to an immediately succeeding position (3) in the dictionary. The reference position (99) in the index table is written in the above-described position (2) in the dictionary 108. The value of the 98th position in the index table 109 corresponding to the value (98) retracted to the immediately succeeding position (3) is updated to the retracted position (3) of the dictionary. Finally, the number of data 110 registered in the dictionary is incremented.

By repeating operations in the above-described manner, data supplied from the input data source is sequentially encoded, and is output to the external apparatus.

When the maximum number N of data registered in the dictionary table 108 is 256, all 1-byte words can be registered. Hence, all of the words can be processed according to the above-described processing. If N is less than 256, the dictionary becomes, in some cases, full during processing. In such a case, when newly registering a word thereafter, the word registered at the last position of the dictionary is deleted from the dictionary, and the contents of the index table corresponding to that word are initialized to NULL. Accordingly, when a word deleted from the dictionary is again read, the word is dealt with as an unregistered word.

Figure 16:
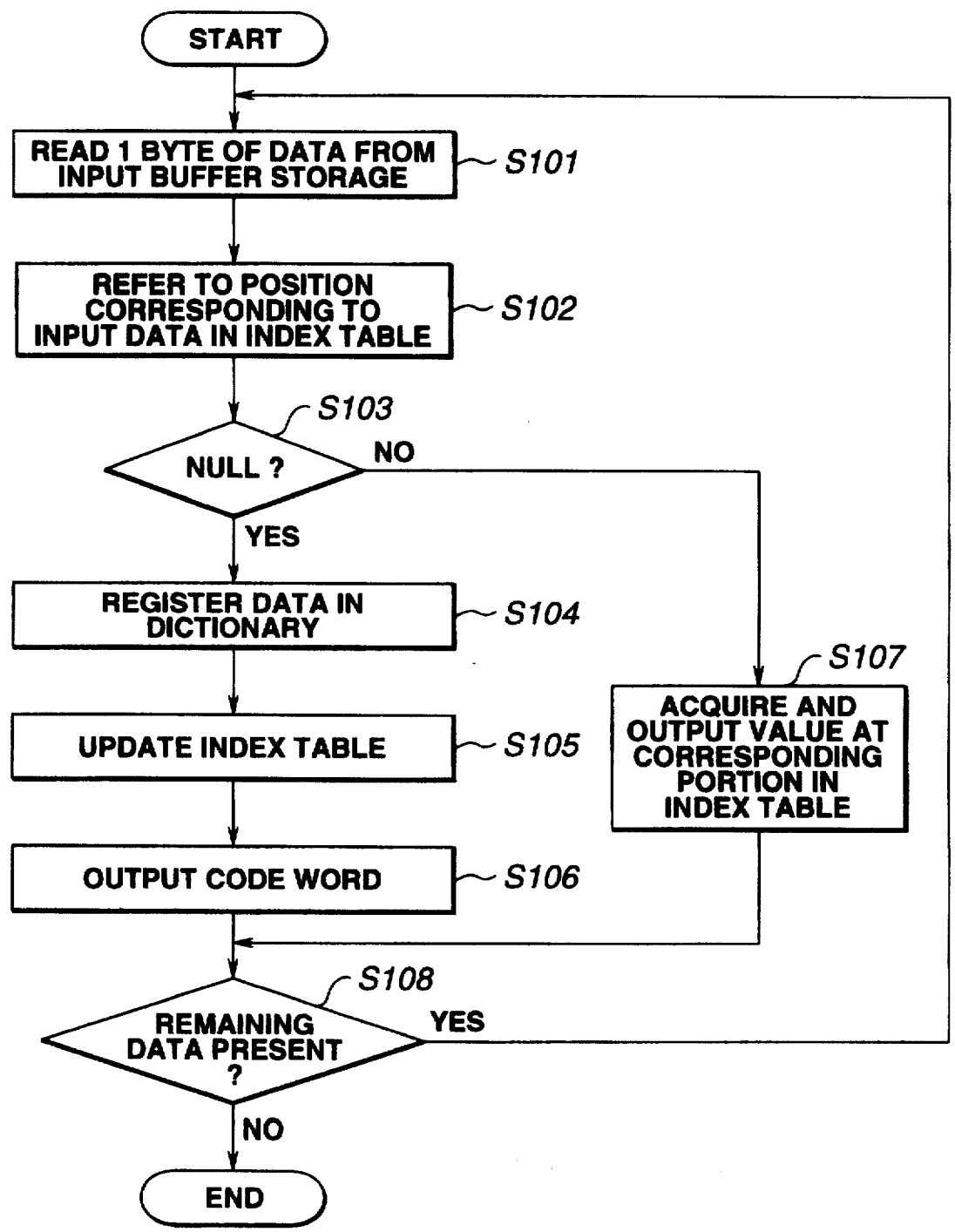
FIG. 16 is a flowchart illustrating the flow of compression control processing in the first embodiment.

The flow of the above-described data compression will now be briefly described with reference to the flowchart shown in FIG. 16.

When the data compression program is started, in step S101, the CPU 102 reads 1 byte of data from the input buffer storage 103.

In step S102, if the input 1-byte data is a character code, the ASCII code for that code is referred to. If the input 1-byte data is image data (a bit map), the index table 109 corresponding to the numerical value when the 1-byte data is represented by binary notation is referred to.

In step S103, it is determined if the value referred to in step S102 is NULL. If the result of the determination in step S103 is affirmative, the process proceeds to step S104. If the result of the determination in step S103 is negative, i.e., if a register number in the dictionary 108 has been acquired, the process proceeds to step S107.

In step S104, as described with reference to FIGS. 3 through 11, the numerical value of the 1-byte data is registered at a position immediately before the last position of the dictionary 108, and the process proceeds to step S105. In step S105, as described with reference to FIGS. 3 through 11, the value of the index table is updated so as to correspond to the dictionary.

In step S106, as described with reference to FIGS. 3 through 11, the number of words 110 registered in the dictionary before registering the current data in the dictionary +1, followed by the numerical value of the 1-byte data, is output as a code word, and the process proceeds to step S108.

In step S107, as described with reference to FIGS. 3 thorough 11, a value present at the position of the index table corresponding to the input data is acquired and is output as a code word. The process then proceeds to step S108.

In step S108, it is determined if succeeding data is present. If the result of the determination in step S108 is affirmative, the process returns to step S101. If the result of the determination in step S108 is negative, the compression program is terminated.

When expanding the data compressed in the code word, similar processing as the compression processing is performed. In expansion processing, however, an index table is unnecessary. An expansion program will now be briefly described.

Before performing expansion, the contents of the dictionary are first cleared. Then, data is read from a code-word memory where compressed data is stored. When reading the data, the value of areas code I is first read. If the above-described data "abaacde" is compressed, "1" is first read. Since the contents of the dictionary have been cleared, nothing is stored in "1" of the dictionary, so that 1 byte of data is read. This 1-byte data is actual data. The read value is registered in the dictionary, and the registered value is output.

Then, the value of areas code I is read to obtain "010", and a position in the dictionary corresponding to this value is checked. Since the position is NULL, another 1-byte data is read and output. This value is registered at a position immediately before the last position in the dictionary, and the value at that position is moved to the succeeding position.

Then, the value of areas code I is read to obtain "010", and a position in the dictionary corresponding to this value is checked. Since data is present at that position, that 1-byte data is output, and the value at that position in the dictionary is replaced by the immediately preceding value.

By thus forming a dictionary from code-word data, data is expanded.

Second Embodiment

Next, a description will be provided of a second embodiment of the present invention. In the second embodiment, data compression processing is applied to a laser-beam printer (hereinafter abbreviated as a "LBP").

Figure 12:
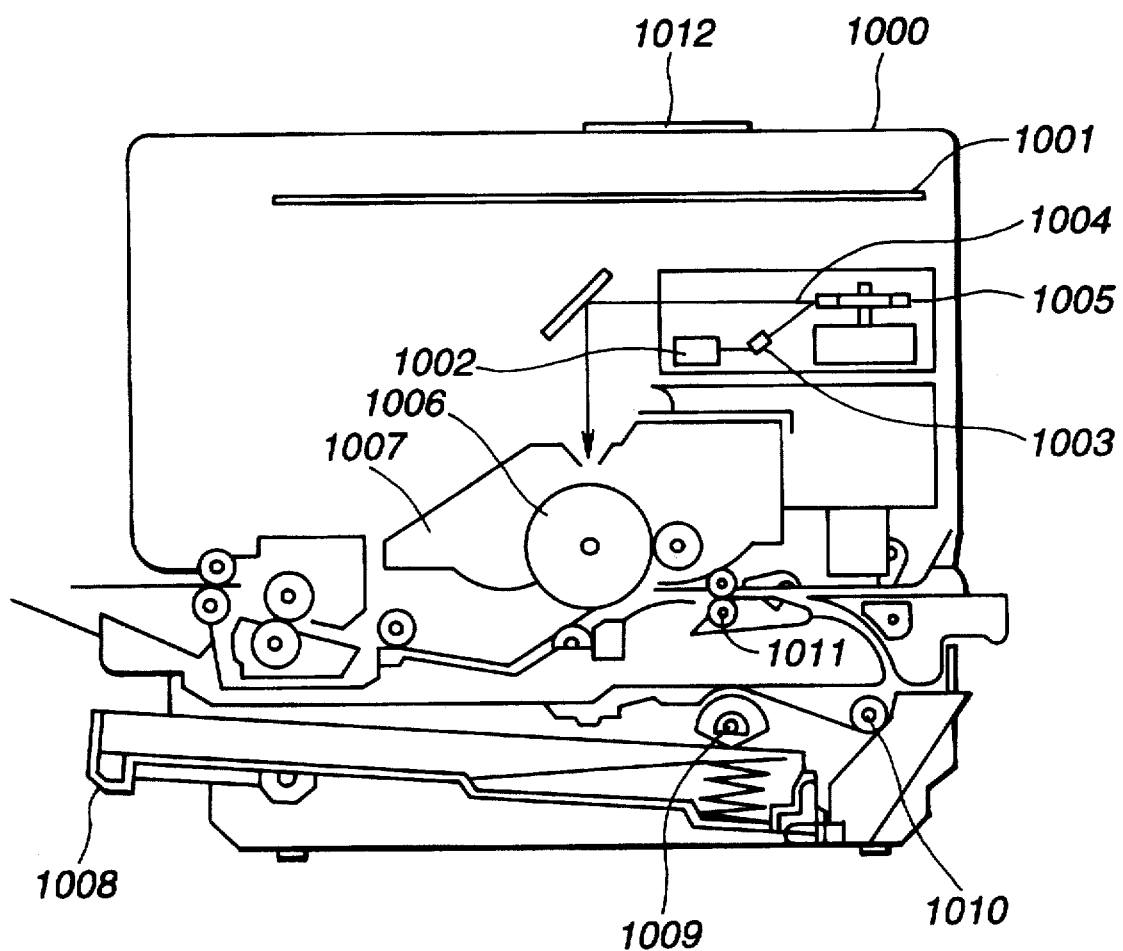
FIG. 12 is a diagram illustrating the configuration of a laser-beam printer according to a second embodiment of the present invention.

FIG. 12 is a cross-sectional view illustrating the internal structure of the LBP. This LBP can register character patterns, document formats (form data), and the like from a dta source (not shown).

In FIG. 12, a main body 1000 of the LBP inputs and stores character information (character codes); forms information, macrocommands and the like; forms a character pattern, a form pattern and the like corresponding to the obtained information; and forms an image on a recording sheet, serving as a recording medium. Switches for operations, an LED (light-emitting diode) display unit and the like are disposed on an operation panel 1012. A printer control unit 1001 controls the entire main body 1000 of the LBP, and analyzes character information or the like supplied from a host computer. The control unit 1001 mainly converts character information into a video signal representing a corresponding character pattern, and outputs the obtained signal to a laser driver 1002. The laser driver 1002 is a circuit for driving a semiconductor laser 1003, and performs on-off switching of laser light 1004 emitted from the semiconductor laser 1003 in accordance with the input video signal. The laser light 1004 is deflected in directions perpendicular to the plane of FIG. 12 to scan the surface of an electrostatic drum 1006. An electrostatic latent image of the character pattern is thereby formed on the electrostatic drum 1006. The electrostatic latent image is developed by a developing unit 1007 provided around the electrostatic drum 1006, and the developed image is transferred onto a recording sheet. A cut sheet is used as the recording sheet. Cut sheets are contained in a sheet cassette 1008 mounted in the main body 1000, and are individually fed into the main body 1000 of the LBP by a sheet feeding roller 1009 and conveying rollers 1011. The fed sheet is then supplied to the electrostatic drum 1006.

Figure 13:
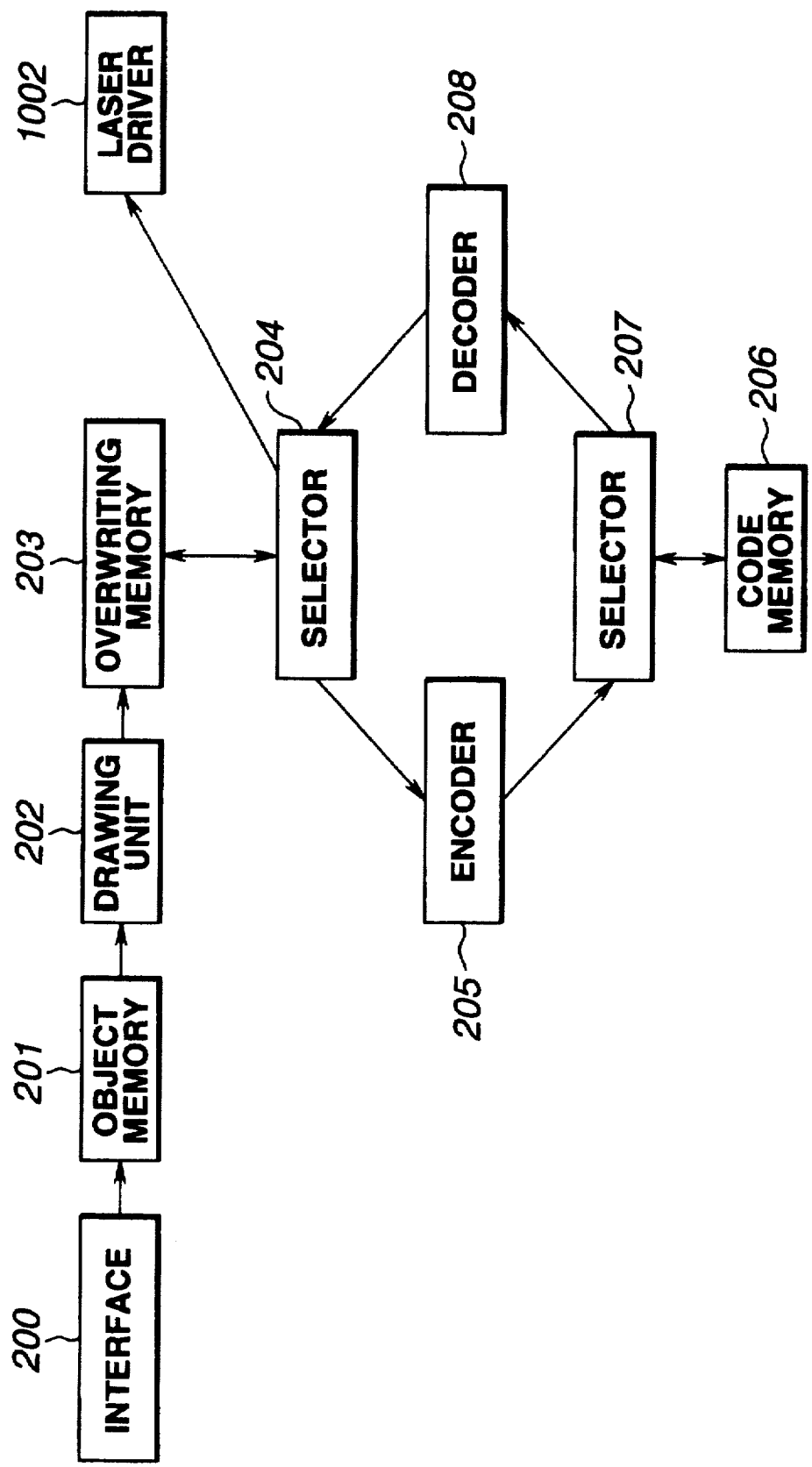
FIG. 13 is a block diagram illustrating the configuration of a control unit 1001 shown in FIG. 12.

FIG. 13 is a block diagram illustrating the function of an image-data generating portion of the control unit 1001 of the main body 1000 of the LBP. In general, in order to reduce an amount stored in a memory, generated image data is stored by being encoded and compressed.

An interface 200 receives so-called PDL data, comprising character information and the like, supplied from the host computer. An object memory 201 stores a command necessary for depicting an image (object codes) from among control commands input from the interface 200. A drawing unit 202 interprets object codes, and draws an image using the object codes as image data. An overwriting memory 203 develops the image data generated in the drawing unit 202. Image data is formed by overwriting newly generated image data on existing image data. The overwriting memory 203 has a storage capacity for one narrow rectangular block when the entire image is divided into a plurality of narrow rectangular blocks. The narrow rectangular block is hereinafter termed a "band". A selector 204 controls input/output to/from the overwriting memory 203, and outputs decoded image data to the laser driver 1002 while controlling the data. An encoder 205 corresponds to the compression apparatus in the first embodiment. A code memory 206 stores codes of image data. A selector 207 controls input/output to/from the code memory 206. A decoder 208 decodes (expands) encoded data generated by the encoder 205 as described in the first embodiment.

A compression operation is performed using such a compression apparatus. The processing in the second embodiment is performed in the following case.

Figure 14:
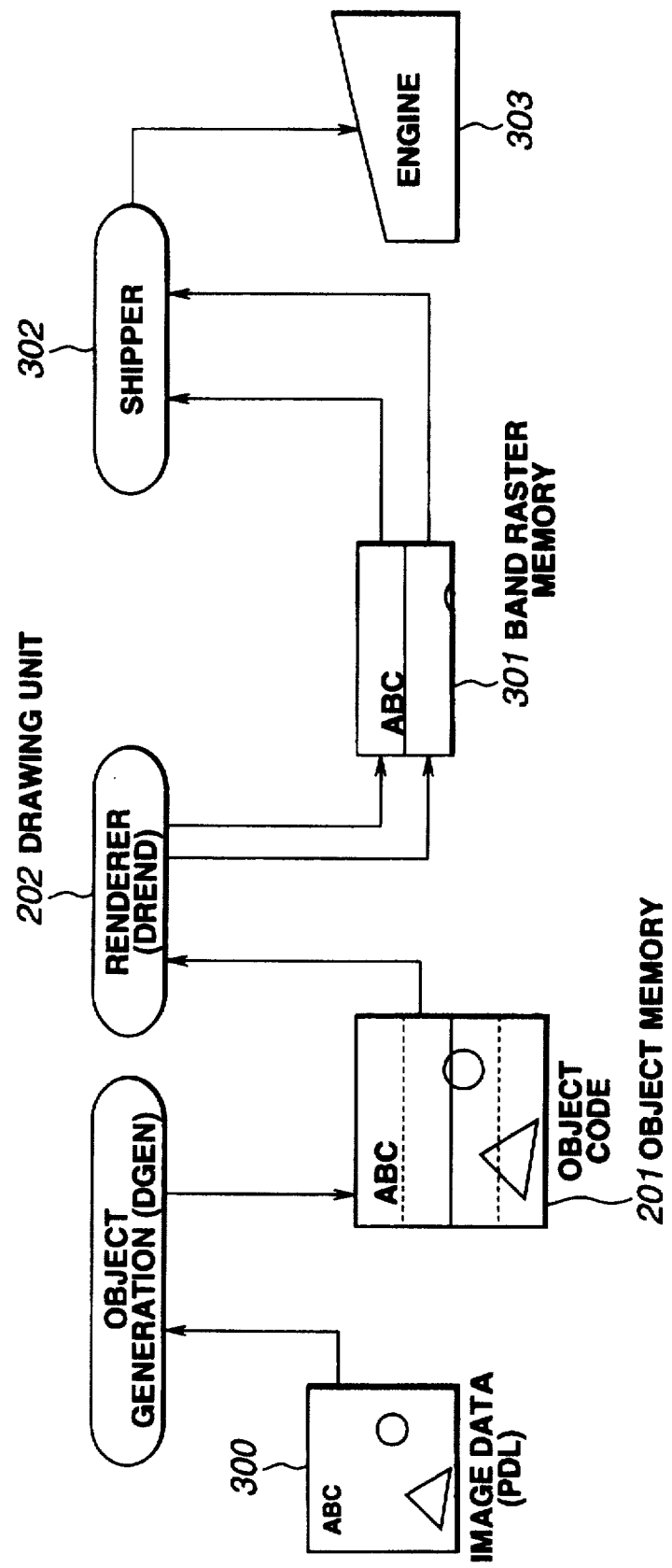
FIG. 14 is a diagram illustrating the flow of ordinary image processing in the second embodiment.

FIG. 14 is a block diagram illustrating the flow of ordinary image output. In FIG. 14, the same portions as in FIG. 13 are indicated by the same reference numerals.

The interface 200 receives image data 300 (PDL) supplied from the host computer. The CPU 102 stores commands (object codes) necessary for depicting an image in the object memory 201. The drawing unit 202 reads the oject codes stored in the object memory 201, and develops (renders) the read data in a band raster memory 301. The band raster memory 301 has a storage capacity for two bands. First, the drawing unit 202 reads object codes for two bands (first and second bands), and writes developed objects in the band raster memory 301. The same memory may be used as the overwriting memory 203 and the band raster memory 301. When object codes present in the first two bands have been written in the band raster memory 301, a shipper 302 outputs the first band to an engine 303. When the first band has been output to the engine 303, the shipper 302 then outputs the second band to the engine 303. When the shipper 302 has started to output the second band to the engine 303, the drawing unit 202 reads the object code to be drawn in the third band from the object memory 201, and writes the object code in a region of the band raster memory 301 where the first band is present. As described above, in ordinary processing, image data 300 is developed (rendered) and output to the engine 303 by alternately writing image data (object codes) in bands and outputting the written data.

Figure 15:
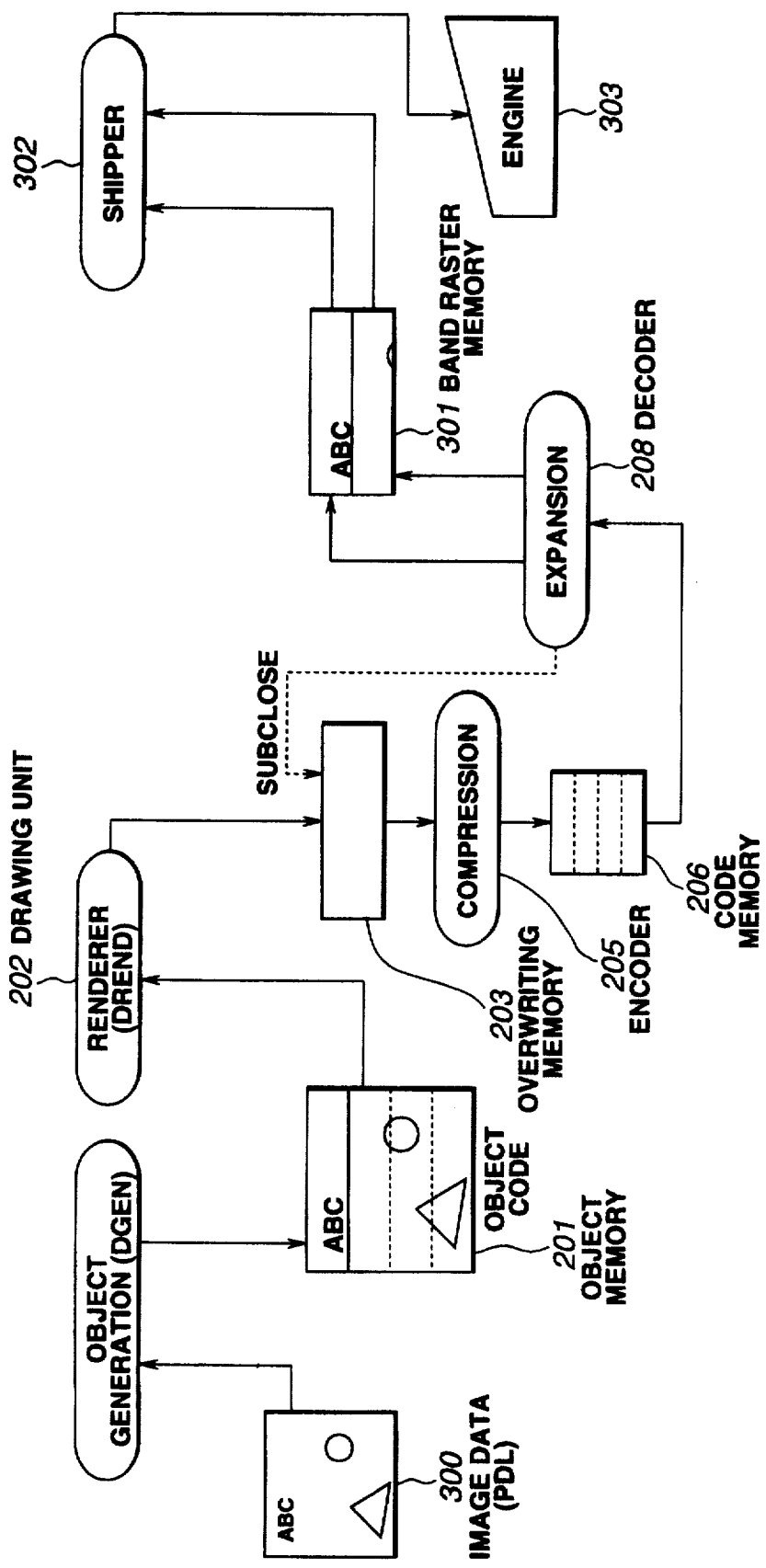
FIG. 15 is a diagram illustrating the flow of image compression processing in the second embodiment.

However, when, for example, complicated and wide-range image data is input, all object codes cannot, in some cases, be stored in the object memory 201. This problem is solved by compressing bands. This processing will now be described with reference to the block diagram shown in FIG. 15, which illustrates the flow of compression processing, and the block diagram shown in FIG. 13 which illustrates the image-data generating portion of the control unit 1001. In FIG. 15, the same portions as in FIG. 14 are indicated by the same reference numerals.

Before starting the operation, the CPU 102 clears values in the object memory 201, the overwriting memory 203, the code memory 206 and the band raster memory 301, and resets the encoder 205 and the decoder 208. The selector 204 selects the decoder 208 and the overwriting memory 203 as a device from which data is to be input and as a device to which data is to be output, respectively. The selector 207 selects the code memory 206 and the decoder 208 as a device from which data is to be input and as a device to which data is to be output, respectively.

When image data (PDL) 300 has been input from the host computer via the interface 200, the CPU 102 selects only object codes within the image data 300 and stores the selected data in the object memory 201. In this case, a maximum amount of object codes which can be stored in the object memory 201 is stored. When the object codes have been stored in the object memory 201, the drawing unit 201 reads the stored data in the sequence of writing, and determines a band to be written. The drawing unit 202 reads code data of the necessary band from the code memory 206, and inputs the read data to the decoder 208 via the selector 207. The decoder 208 decodes the input code data, and writes obtained image data in the overwriting memory 203 via the selector 204. Since, at first, data in the code memory 206 has been cleared, the image data is not decoded, and data in the overwriting memory 203 is cleared. The drawing unit 202 interprets the object code read from the object memory 201, develops the object code into raster data, and overwrites the developed data on raster data in the overwriting memory 203. Then, the drawing unit 202 reads the next object code from the object memory 201. If the read object code represents an object to be written in the same band, the drawing unit 202 interprets the object code, develops the object code into raster data, and overwrites the obtained data on raster data in the overwriting memory 203. If the read object code represents an object to be present in a different band, the contents of the overwriting memory 203 are input to the decoder 205 via the selector 204. Raster data input to the encoder 205 is encoded according to the processing of the first embodiment. The obtained code data is written in a vacant region of the code memory 206 via the selector 207, and code data in the original band is deleted. Then, the drawing unit 202 reads the next object code, and determines a band to be written. The same processing is thereafter repeated.

When all of the object codes stored in the object memory 201 have been processed, the object codes in the object memory 201 are cleared, and remaining object codes which could not be stored in the object memory 201 are stored. When the object codes have been stored in the object memory 201, the drawing unit 202 reads the stored codes in the sequence of writing, and determines a band to be written. The same processing is thereafter performed.

When all of the object codes stored in the object memory 201 have been processed, it is determined if object codes which have not been stored in the object memory 201 are present in the image data 300. If the result of the determination is affirmative, the above-described processing is repeated until all image data can be stored and developed in the object memory 201 as object codes, and the obtained data can be stored in the code memory 206. If the result of the determination is negative, the CPU 102 sets the code memory 206 and the decoder 208 as a device from which data is to be input to the selector 207 and as a device to which data is to be output from the selector 207, respectively, and sets the decoder 208 and the shipper 302 as a device from which data is to be input to the selector 204 and as a device to which data is to be output from the selector 204, respectively. The CPU 102 sequentially reads encoded data from the leading band of the image from the code memory 206, transmits the read data to the decoder 208 via the selector 207, decodes encoded data using the decoder 208, and outputs obtained image data from the selector 204 to the engine 303 of the laser driver 1002 via the shipper 302. The laser driver 1002 controls emission of the semiconductor laser 1003 in accordance with the image data, to form an image.

Other Embodiments

Although, in the first embodiment, the number of words currently registered in the dictionary+1 is used as an intermediate code value indicating that the concerned word is not yet registered, the maximum number of words registered in the dictionary+1 may also be used. In this case, since a code word indicating the word is not yet registered is fixed, the processing system during decoding is simplified. However, since the code length of an actual code word indicating the concerned word is not yet registered becomes relatively long, the compression ratio is more or less reduced.

Although, in the first embodiment, an input word is rearranged in the dictionary by replacing an immediately preceding word, the input word instead may be instantaneously moved to the head of the dictionary. In this case, however, it is necessary to sequentially move words registered at positions before the appeared word, and to up-date the index table for all of the moved words, the processing speed is, in some cases, greatly reduced. On the other hand, the compression ratio is expected to be improved depending on data.

Although, in the first embodiment, the size of the index table is set to the maximum number of words (256 since a word comprises 1 byte), the size can be reduced if it is equal to or greater than the maximum number of words registered in the dictionary by using a hash function or the like. Particularly when a word comprises at least 2 bytes, if the size is set to the maximum number of words, the size of the index table becomes very large. Hence, such reduction in the size of the table is effective. The unit of a word must be determined according to the characteristics of data. That is, a unit of 1 byte is desirable for 1-byte-type data such as European languages, and a unit of 2 bytes is desirable for 2-byte-type data such as the Japanese language. However, if the number of bytes is increased too much, the amount of the dictionary or the index table becomes very large, while the rate of coincidence between words decreases.

Although, in the first embodiment, areas codes are used as variable-length codes, any other variable-length codes, such as Huffman codes or the like, may also be used.

If the frequency distribution of numbers in the dictionary in intermediate code words is obtained by performing the entire processing, and Huffman coding is performed based on the obtained distribution, the compression ratio is improved. However, the greatest advantage of the compression method in the present invention, that compression can be processed through a single path at a high speed, disappears. For example, a method may be adopted in which the frequency distribution of numbers in the dictionary is obtained by compressing data with fixed variable-length codes, such as areas codes or the like, and data is recompressed using adaptive Huffman codes based on the frequency distribution while expanding compressed data only when the compression ratio is degraded.

Although in the second embodiment a laser-beam printer is used as the printer, the present invention is not limited to such a printer. For example, a bubble-jet printer, an ink-jet printer or the like may also be used.

Although in the second embodiment the compression processing is used when developing data into bit-map data to be output, the compression processing is, of course, not limited to such a case. For example, the compression processing may also be used when inputting image data (PDL) 300, serving as code data from the host computer, and storing the input data as compressed. Since the compression processing can be performed in a single path, it is most suitable when it is intended to simultaneously store data as it is compressed, as in this case.

It is also possible to provide the functions of the above-described embodiments by a host computer, serving as an external apparatus. That is, the objects of the present invention may be achieved by supplying a system or an apparatus with a storage medium storing program codes of software for realizing the functions of the above-described embodiments, and reading and executing the program codes stored in the storage medium by a computer (or a CPU or an MPU (microprocessor unit)) of the system or the apparatus.

In such a case, the program codes themselves read from the storage medium realize the functions of the above-described embodiments, so that the storage medium storing the program codes achieves the object of the present invention.

The storage medium storing the program codes has a configuration as shown in FIG. 17. The storage medium stores directory information at a first position, and also stores a data compression program and a data expansion program described in the first embodiment, and a code table.

For example, a floppy disk, a hard disk, an optical disk, a magnetooptical disk, a CD (compact disk)-ROM, a magnetic tape, a nonvolatile memory card, a ROM or the like may be used as the storage medium for supplying the program codes.

The present invention may also be applied not only to a case in which the functions of the above-described embodiments are realized by executing program codes read by a computer, but also to a case in which an OS (operating system) or the like operating in a computer executes a part or the entirety of actual processing, and the functions of the above-described embodiments are realized by the processing.

The present invention may also be applied to a case in which, after writing program codes read from a storage medium into a memory provided in a function expanding board inserted into a computer or in a function expanding unit connected to the computer, a CPU or the like provided in the function expanding board or the function expanding unit performs a part or the entirety of actual processing, and the functions of the above-described embodiments are realized by the processing.

As described above, the present invention relates to a data compression apparatus which deals with input data as a set of words having a specific number of bytes, and retrieves a word in a dictionary. If the word is not found in the dictionary, the word is registered in the dictionary. If the word is found in the dictionary, the position of registration of the word is updated to a forward position. Information relating to the position of each word in the dictionary is output in the form of a variable-length code. The apparatus also includes a word retrieval table having a size equal to or greater than the size of the dictionary. An input word is retrieved from the dictionary using the word retrieval table. Every time the contents of the dictionary are updated, the word retrieval table is updated. Hence, it is possible to realize high-speed data compression processing through a single path.

As a result, in output processing in which compression and expansion of image data must be repeated a plurality of times, the time required for compression and expansion is shortened, so that data can be output without requiring a large amount of processing time.

The individual components designated by blocks in the drawings are all well-known in the data compression apparatus, method and system arts and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A data compression apparatus for compressing input data, said apparatus comprising:

dictionary means for registering words;

word retrieval table means for storing information relating to a position of each word stored in said dictionary means;

encoding means for performing variable-length encoding of information relating to the position of an input word in the dictionary; and expansion means for returning a variable-length code obtained by said encoding means to an original word, wherein input data is dealt with as a set of words having a specific number of bytes, a word is retrieved by said word retrieval table means, and if the word is not found, the word is registered in said dictionary means, and if the word is found, the position of registration of the word is updated to a forward position, and every time contents of the dictionary means are updated, said word retrieval table means is updated.

2. An apparatus according to claim 1, wherein the input data comprises image data including object codes, serving as commands necessary for drawing an image.

3. An apparatus according to claim 2, further comprising:
   object storage means for storing the object codes; and
   code storage means for storing the input data subjected to variable-length encoding by said encoding means,
   wherein, when all of the object codes cannot be stored in said object storage means, the input data is subjected to variable-length encoding by said encoding means.

4. An apparatus according to claim 1, wherein the input data comprises image data.

5. An apparatus according to claim 1, wherein, when the word is not found in said word retrieval table means, said apparatus outputs both of the variable-length code representing the information relating to the position of the word and a code representing the word, and when the word is found in said word retrieval table means, said apparatus outputs the variable-length code representing the information relating to the position of the word.

6. A data compression method for compressing input data, said method comprising the steps of:
   registering words in a dictionary;
   storing information relating to a position of each word stored in the dictionary in said registering step in a word retrieval table;
   performing variable-length encoding of information relating to the position of an input word registered in the dictionary in said registering step; and
   returning a variable-length code obtained by said encoding step to an original word,
   wherein input data is dealt with as a set of words having a specific number of bytes, a word is retrieved from the word retrieval table storing the information relating to the position of each word, and if the word is not found, the word is registered in the dictionary in said registering step, and if the word is found, the position of registration of the word is updated to a forward position, and every time said registration step updates contents registered in the dictionary, said position-information storing step updates the information relating to the position of each word in the word retrieval table.

7. A method according to claim 6, wherein the input data comprises image data including object codes, serving as commands necessary for drawing an image.

8. A method according to claim 7, further comprising the steps of:
   storing the object codes in object storage means; and
   storing the input data subjected to variable-length encoding by said encoding step in code storage means,
   wherein, when all of the object codes cannot be stored in the object storage means, the input data is subjected to variable-length encoding in said encoding step.

9. A method according to claim 6, wherein the input data comprises image data.

10. A method according to claim 6, wherein, when the word is not found in the word retrieval table, said method outputs both of the variable-length code representing the information relating to the position of the word and a code representing the word, and when the word is found in the word retrieval table, said method outputs the variable-length code representing the information relating to the position of the word.

11. A program stored in a storage medium for realizing compression of input data, said program comprising:
    program code for a registering step of registering words in a dictionary,
    program code for a position-information storing step of storing information relating to a position of each word registered in the dictionary in the registering step in a word retrieval table;
    program code for an encoding step of performing variable-length encoding of information relating to the position of an input word registered in the dictionary in the registering step; and
    program code for an expanding step of returning a variable-length code obtained by the encoding step to an original word,
    wherein input data is dealt with as a set of words having a specific number of bytes, a word is retrieved from the word retrieval table storing the information relating to the position of each word, and if the word is not found, the word is registered in the dictionary in the registering step, and if the word is found, the position of registration of the word is updated to a forward position, and every time the registering step updates contents registered in the dictionary, the position-information storing step updates the information relating to each word in the word retrieval table.

12. A program according to claim 11, wherein the input data comprises image data including object codes, serving as commands necessary for drawing an image.

13. A program according to claim 12, further comprising:
    program code for an object storing step of storing the object codes in object storage means; and
    program code for a code storing step of storing the input data subjected to variable-length encoding by said encoding step in code storage means,
    wherein, when all of the object codes cannot be stored in the object storage means, the input data is subjected to variable-length encoding in said encoding step.

14. A program according to claim 11, wherein the input data comprises image data.

15. A program according to claim 11, wherein, when the word is not found in the word retrieval table, said program outputs both of the variable-length code representing the information relating to the position of the word and a code representing the word, and when the word is found in the word retrieval table, said program outputs the variable-length code representing the information relating to the position of the word.

16. A printing system in which a host computer transmits printing data to a printer, and the printer prints the printing data received from the host computer, said system comprising:
    dictionary means for registering words;
    word retrieval table means for storing information relating to a position of each word stored in said dictionary means;
    encoding means for performing variable-length encoding of information relating to the position of an input word in said dictionary means; and
    expansion means for returning a variable-length code obtained by said encoding means to an original word,
    wherein input data is dealt with as a set of words having a specific number of bytes, a word is retrieved by said word retrieval table means, and if the word is not found, the word is registered in said dictionary means, and if the word is found, the position of registration of the word is updated to a forward position, and every time contents of said dictionary means are updated, said word retrieval table means is updated.

17. A system according to claim 16, wherein said dictionary means, said word retrieval table means, said encoding means and said expansion means are provided at the printer side.

18. A system according to claim 16, wherein the printing data comprises image data including object codes, serving as commands necessary for drawing an image.

19. A system according to claim 18, further comprising:

object storage means for storing the object codes; and code storage means for storing the printing data subjected to variable-length encoding by said encoding means, wherein, when all of the object codes cannot be stored in said object storage means, the printing data is subjected to variable-length encoding by said encoding means.

20. A system according to claim 16, wherein the printing data comprises image data.

21. A system according to claim 16, wherein, when the word is not found in said word retrieval table means, said system outputs both of the variable-length code representing the information relating to the position of the word and a code representing the word, and when the word is found in said word retrieval table means, said system outputs the variable-length code representing the information relating to the position of the word.

* * * * *

UNITED STATES PATENT AND TRADEMARK OFFICE
CERTIFICATE OF CORRECTION

PATENT NO. : 5,907,638
DATED : May 25, 1999
INVENTOR(S) : KEN ONODERA

It is certified that error appears in the above-identified patent and that said Letters Patent is hereby corrected as shown below:

COLUMN 14

Line 4, "dictionary," should read --dictionary;--.

Signed and Sealed this

Second Day of November, 1999

Q. TODD DICKINSON

Attest:

Attesting Officer

Acting Commissioner of Patents and Trademarks